United States Patent
Lin et al.

(10) Patent No.: US 9,847,315 B2
(45) Date of Patent: Dec. 19, 2017

(54) PACKAGES, PACKAGING METHODS, AND PACKAGED SEMICONDUCTOR DEVICES

(71) Applicant: Taiwan Semiconductor Manufacturing Company, Ltd., Hsin-Chu (TW)

(72) Inventors: Shih Ting Lin, Taipei (TW); Szu Wei Lu, Hsin-Chu (TW); Jui-Pin Hung, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 141 days.

(21) Appl. No.: 14/015,832

(22) Filed: Aug. 30, 2013

(65) Prior Publication Data
US 2015/0061149 A1     Mar. 5, 2015

(51) Int. Cl.
*H01L 23/00*     (2006.01)
*H01L 23/48*     (2006.01)
*H01L 23/31*     (2006.01)

(52) U.S. Cl.
CPC ............ *H01L 24/82* (2013.01); *H01L 23/481* (2013.01); *H01L 24/19* (2013.01); *H01L 23/3128* (2013.01); *H01L 2224/12105* (2013.01); *H01L 2224/48091* (2013.01); *H01L 2224/73267* (2013.01); *H01L 2224/97* (2013.01); *H01L 2225/0651* (2013.01); *H01L 2225/06568* (2013.01); *H01L 2225/1035* (2013.01); *H01L 2225/1047* (2013.01); *H01L 2225/1058* (2013.01); *H01L 2924/01322* (2013.01); *H01L 2924/12042* (2013.01); *H01L 2924/15311* (2013.01); *H01L 2924/181* (2013.01)

(58) Field of Classification Search
CPC ............................. H01L 23/481; H01L 24/82
See application file for complete search history.

(56) References Cited

U.S. PATENT DOCUMENTS

| | | | |
|---|---|---|---|
| 7,335,972 B2* | 2/2008 | Chanchani | 257/686 |
| 2007/0212865 A1* | 9/2007 | Amrine | H05K 3/4069 438/597 |
| 2007/0284729 A1* | 12/2007 | Kwon | H01L 21/76898 257/700 |
| 2009/0051039 A1* | 2/2009 | Kuo et al. | 257/774 |
| 2009/0140442 A1* | 6/2009 | Lin | 257/778 |

(Continued)

FOREIGN PATENT DOCUMENTS

JP     2009117564 A  *  5/2009  ............ H01L 23/12

OTHER PUBLICATIONS

Al-Sarawi, Said F., "Solder Bump Bonding," http://www.eleceng.adelaide.edu.au/Personal/alsarawi/node9.html, Jun. 21, 2007.*

*Primary Examiner* — Joseph C Nicely
(74) *Attorney, Agent, or Firm* — Slater Matsil, LLP

(57) ABSTRACT

Packages, packaging methods, and packaged semiconductor devices are disclosed. In some embodiments, a package for a semiconductor device includes a redistribution layer (RDL) and a plurality of through package vias (TPV's) coupled to the RDL. Each of the plurality of TPV's comprises a first region proximate the RDL and a second region opposite the first region. The first region comprises a first width, and the second region comprises a second width. The second width is greater than the first width.

20 Claims, 7 Drawing Sheets

(56) References Cited

U.S. PATENT DOCUMENTS

| | | | |
|---|---|---|---|
| 2009/0166873 A1* | 7/2009 | Yang et al. | 257/758 |
| 2010/0059853 A1* | 3/2010 | Lin | H01L 27/016 257/528 |
| 2010/0187670 A1* | 7/2010 | Lin et al. | 257/686 |
| 2010/0244247 A1* | 9/2010 | Chang | H01L 21/76898 257/741 |
| 2011/0068444 A1* | 3/2011 | Chi | H01L 21/6835 257/669 |
| 2011/0285005 A1* | 11/2011 | Lin | H01L 21/4846 257/686 |
| 2011/0291153 A1* | 12/2011 | Yang et al. | 257/99 |
| 2011/0304999 A1* | 12/2011 | Yu et al. | 361/783 |
| 2012/0007154 A1* | 1/2012 | Lin et al. | 257/288 |
| 2012/0217611 A1* | 8/2012 | Liu et al. | 257/508 |
| 2012/0261827 A1* | 10/2012 | Yu et al. | 257/774 |
| 2013/0069239 A1* | 3/2013 | Kim et al. | 257/774 |
| 2013/0075937 A1* | 3/2013 | Wang | H01L 25/0655 257/782 |
| 2013/0134548 A1* | 5/2013 | Torii | 257/508 |
| 2013/0193585 A1* | 8/2013 | Lin et al. | 257/774 |
| 2013/0207241 A1* | 8/2013 | Lee | H01L 21/76898 257/621 |
| 2013/0320554 A1* | 12/2013 | Barth | H01L 23/481 257/774 |
| 2014/0021161 A1* | 1/2014 | Win et al. | 216/13 |
| 2014/0048937 A1* | 2/2014 | Bae | H01L 23/5384 257/751 |
| 2014/0117556 A1* | 5/2014 | Lin | H01L 25/043 257/774 |
| 2014/0235053 A1* | 8/2014 | Chern | H01L 21/02057 438/667 |
| 2014/0264917 A1* | 9/2014 | Huang | H01L 21/76879 257/774 |
| 2014/0353843 A1* | 12/2014 | Ning | H01L 23/5226 257/774 |
| 2015/0062851 A1* | 3/2015 | Shimizu | H05K 1/115 361/767 |
| 2015/0262909 A1* | 9/2015 | Chen | H01L 21/6835 257/774 |

* cited by examiner

PACKAGES, PACKAGING METHODS, AND PACKAGED SEMICONDUCTOR DEVICES

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Packages for semiconductor devices, packaging methods for semiconductor devices, and packaged semiconductor devices that utilize novel methods of forming through package vias (TPV's) will be described herein.

Figure 1:
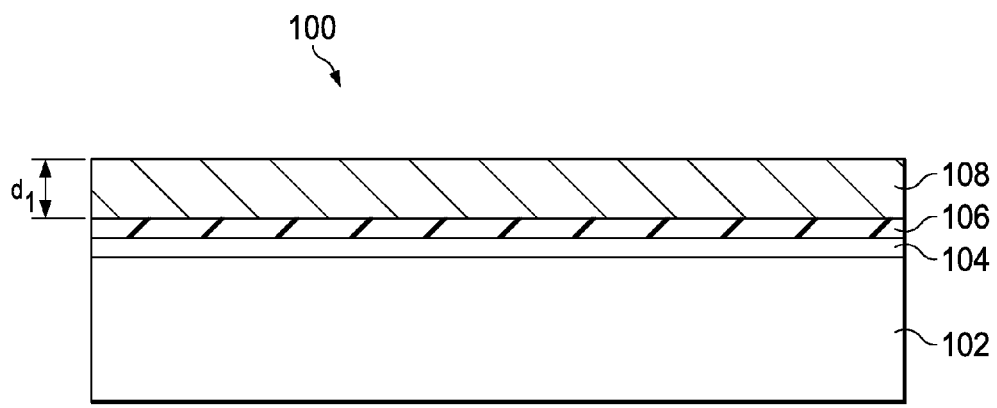
FIGS. 1 through 13 illustrate cross-sectional views of a method of packaging a semiconductor device in accordance with some embodiments of the present disclosure.

FIGS. 1 through 13 illustrate cross-sectional views of a method of packaging a semiconductor device in accordance with some embodiments of the present disclosure. Referring first to FIG. 1, a package 100 for a semiconductor device is shown. To form the package 100, a carrier wafer 102 is provided. The carrier wafer 102 comprises a glass or semiconductor substrate in some embodiments, as examples. Alternatively, the carrier wafer 102 may comprise other materials.

An adhesive layer 104 is formed on the carrier wafer 102. The adhesive layer 104 comprises a die attach film (DAF) in some embodiments. Alternatively, the adhesive layer 104 may comprise other materials. An insulating material 106 is formed over the adhesive layer 104. The insulating material 106 comprises a polymer material having a thickness of about 0.1 µm to about 1,000 µm in some embodiments. The polymer material may comprise polyimide (PI), polybenzoxazole, (PBO), or epoxy, as examples, or other types of polymer materials. Alternatively, the insulating material 106 may comprise other materials and dimensions. In some embodiments, the adhesive layer 104 and the insulating material 106 comprise an Ajinomoto Build-up Film (ABF), as another example. The adhesive layer 104 and insulating material 106 function as a glue/polymer base buffer layer in some embodiments, for example. In some embodiments, the adhesive layer 104 is not included and only an insulating material 106 is used. In other embodiments, the insulating material 106 is not included and only an adhesive layer 104 is used, as another example.

A conductive material 108 is formed over the carrier wafer 102. A conductive material 108 is formed over the insulating material 106 disposed over the carrier wafer 102, also shown in FIG. 1, for example. The conductive material 108 comprises a thick layer of copper in some embodiments. In some embodiments, the conductive material 108 comprises copper, aluminum, tungsten, nickel, palladium, gold, or combinations thereof, as another example. The conductive material 108 has a thickness comprises dimension $d_1$ of about 10 µm to about 1,000 µm in some embodiments, for example. Alternatively, the conductive material may comprise other materials and dimensions. The conductive material 108 may be formed by a lamination process or foil application process in some embodiments. Forming the conductive material 108 using a lamination process provides improved height control for the formation of through package vias (TPV's) in some embodiments. Alternatively, the conductive material 108 may be formed using a plating process, sputtering process, or other deposition methods, in other embodiments.

Figure 2:
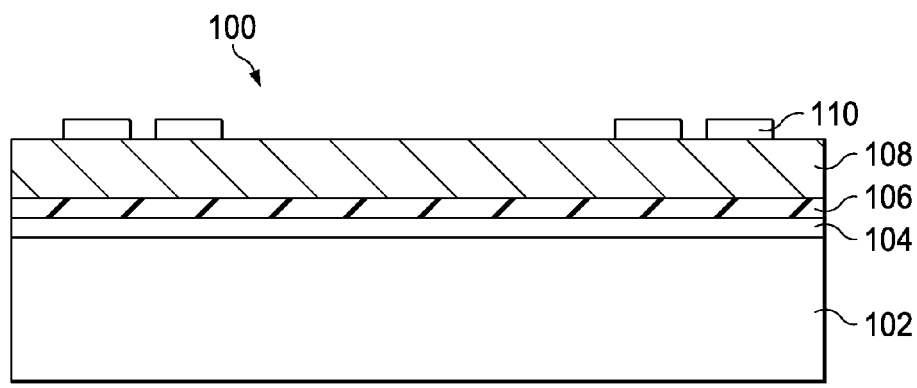

A patterned layer of photoresist 110 is formed over the carrier wafer 102, over the conductive material 108, as shown in FIG. 2. The layer of photoresist 110 is printed onto the carrier wafer 102 in some embodiments. In other embodiments, the layer of photoresist 110 is deposited or formed over the carrier wafer, and the layer of photoresist is patterned using a photolithography process. In a photolithography process, the layer of photoresist 110 is patterned by exposing the layer of photoresist 110 to light or energy reflected from or transmitted through a lithography mask having a desired pattern thereon. The layer of photoresist 110 is then developed, and exposed, or unexposed (depending on whether the layer of photoresist 110 comprises a positive or negative photoresist), portions of the layer of photoresist are then ashed or etched away. Alternatively, the layer of photoresist 110 may be patterned using a direct patterning method or other methods.

Figure 3:
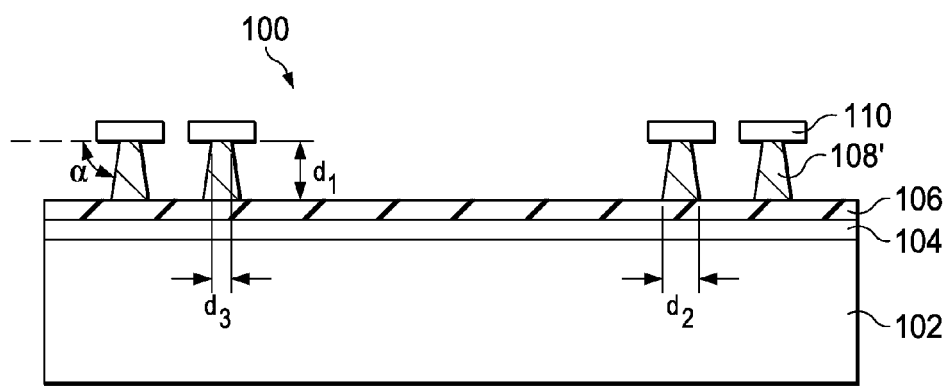

The pattern of the layer of photoresist 110 comprises a pattern for a plurality of through package vias (TPV's) in some embodiments. The layer of photoresist 110 is used as an etch mask while portions of the conductive material 108 are etched away using an etch process, patterning the conductive material 108 and forming a plurality of TPV's 108', as shown in FIG. 3. The etch process comprises a chemical suitable for etching the material of the conductive material 108. As an example, in embodiments wherein the conductive material 108 comprises copper, the etch chemistry may comprise $CuCl_2$ or $FeCl_3$. Alternatively, the etch process may comprise other chemistries. The etch process results in the formation of TPV's 108' that are tapered, having a greater width at the top than at the bottom in some embodiments. For example, each of the TPV's 108' comprise a region proximate the insulating material 106 having a width comprising dimension $d_2$ and a region proximate the layer of photoresist 110 having a width comprising dimension $d_3$, wherein dimension $d_2$ is greater than dimension $d_3$. Dimension $d_2$ comprises about 10 μm to about 1,000 μm in some embodiments. Dimension $d_3$ comprises about 10% to about 95% of dimension $d_2$ in some embodiments, as examples. The relative sizes of dimensions $d_2$ and $d_3$ may vary as a function of the thickness of the conductive material 108 and a process recipe for the etch process, as examples. Alternatively, dimensions $d_2$ and $d_3$ may comprise other values. Dimension $d_3$ is also referred to herein, e.g., in some of the claims, as a first width, and dimension $d_2$ is also referred to herein as a second width. The TPV's 108' have a thickness comprising dimension $d_1$ that is substantially the same as the thickness of the conductive material 108 as deposited.

The TPV's 108' have tapered sidewalls in some embodiments due to the nature of the etch process and the material properties of the conductive material 108. The tapered sidewalls of the TPV's 108' with respect to a horizontal surface (e.g., with respect angle α of the to the patterned layer of photoresist 110 or to a subsequently formed redistribution layer (RDL) 134, not shown in FIG. 3; see FIG. 7) comprises about 75° to about 89° in some embodiments. The angle α of the tapered sidewalls of the TPV's 108' comprises about 45° to about 95° in some embodiments, as another example. Alternatively, the angle α of the tapered sidewalls of the TPV's 108' may comprise other dimensions. The TPV's 108' have substantially straight sidewalls in the embodiments shown in FIG. 3. Alternatively, in other embodiments, the TPV's 108' may have inwardly curved tapered sidewalls, to be described further herein with reference to FIG. 16.

Figure 4:
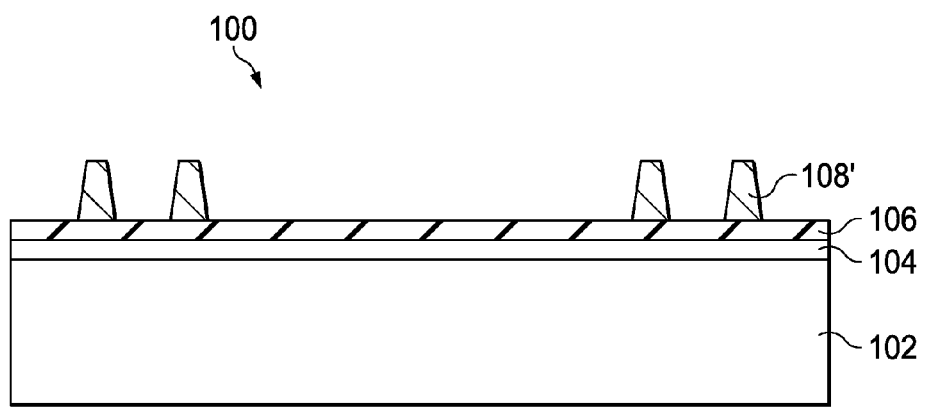

Referring next to FIG. 4, in some embodiments, the layer of photoresist 110 is then removed. The layer of photoresist 110 is removed using an ashing or etch process, for example. In other embodiments, the layer of photoresist 110 is not removed at this stage of the packaging process.

Figure 5:
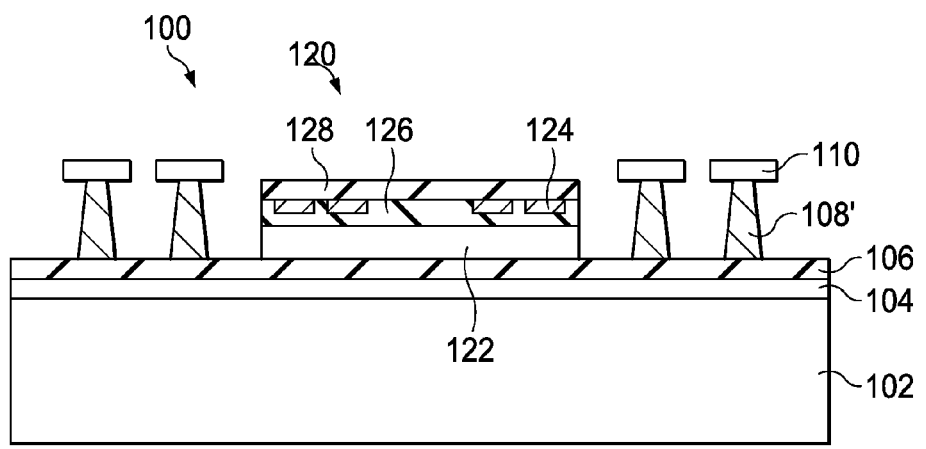

A semiconductor device 120 is then coupled to the carrier wafer 102. The semiconductor device 120 is coupled to the insulating material 106 disposed over the carrier wafer 102, as shown in FIG. 5. The semiconductor device 120 includes an integrated circuit or die 122 and includes a plurality of contacts 124 disposed on a surface thereof. The contacts 124 are disposed within an insulating material 126 in some embodiments. An insulating material 128 is disposed over the contacts 124 and insulating material 126 in some embodiments. Only one semiconductor device 120 is shown in FIG. 5; however, a plurality of semiconductor devices 120 are placed onto the surface of the carrier wafer 102 in accordance with some embodiments.

Figure 6:
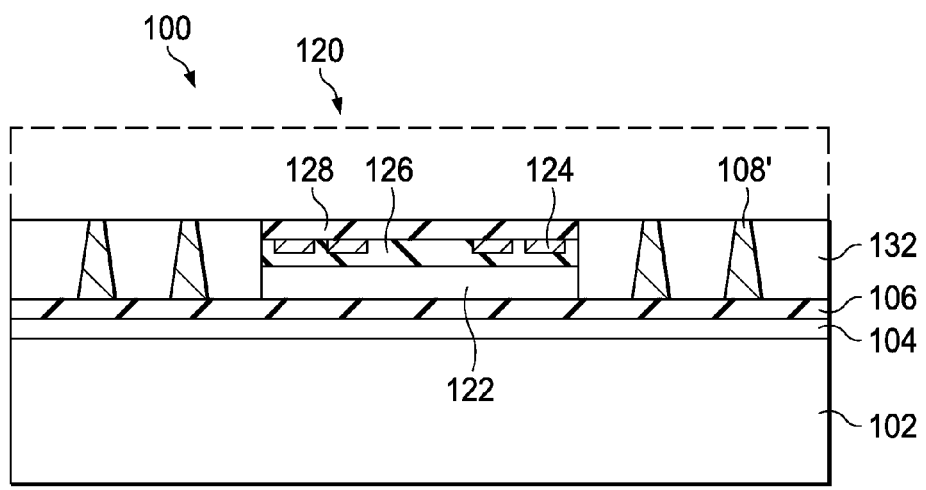

A molding material 132 is formed over the semiconductor device 120, TPV's 108', and exposed portions of the insulating material 106, as shown in FIG. 6. The molding material 132 comprises an insulating material 132 such as a molding compound. After the application of the molding material 132, a top surface of the molding material 132 extends over the top surfaces of the TPV's 108' and the semiconductor device 120, as shown in phantom (e.g., in dashed lines) in FIG. 6. A top portion of the molding material 132 is then removed using a polishing process and/or etch process, exposing the top surfaces of the TPV's 108' and the semiconductor device 120, also illustrated in FIG. 6. In embodiments wherein the layer of photoresist 110 is not removed, the polishing process for the molding material 132 results in the removal of the layer of photoresist 110, in some embodiments, for example.

Figure 7:
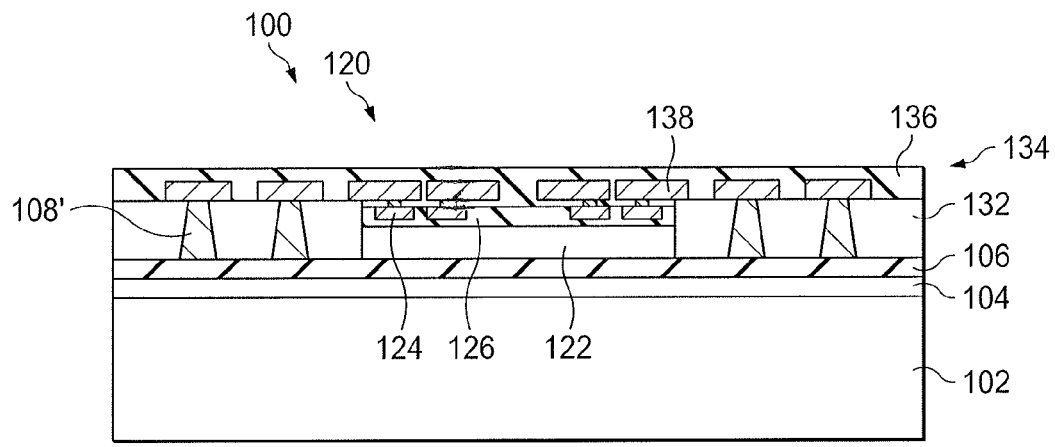

An RDL 134 is then formed over the molding material 132, the TPV's 108', and the semiconductor device 120, as shown in FIG. 7. The RDL 134 comprises one or more insulating material layers 136 and one or more conductive material layers 138. The RDL 134 provides electrical wiring of the package 100 in a horizontal direction, and the TPV's 108' provide electrical wiring of the package 100 in a vertical direction. Portions of the conductive material layer or layers 138 are coupled to some of the TPV's 108' and some of the contacts 124 of the semiconductor device 120 in some embodiments. Portions of the conductive material layer 138 comprise an under-ball metallization (UBM) in some embodiments, for example.

Figure 8:
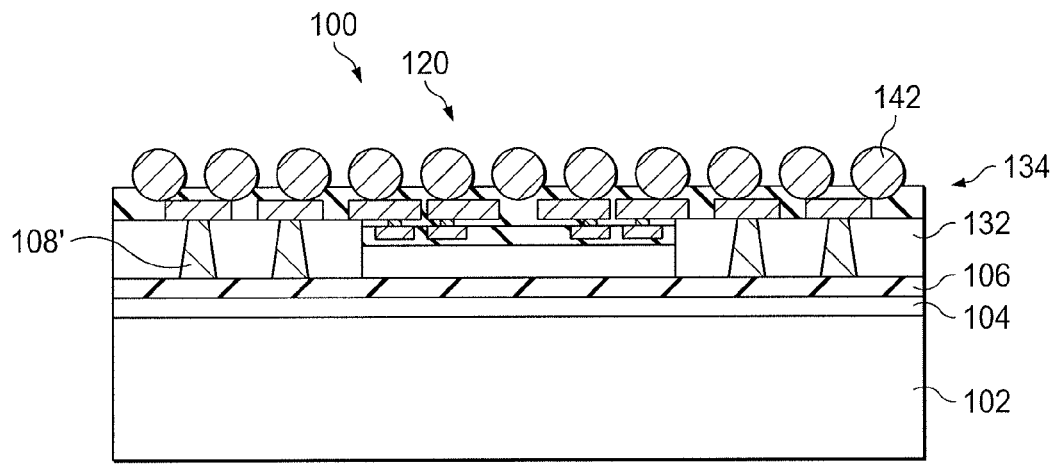

A plurality of conductive balls 142 is coupled to portions of the conductive material layer 138, as shown in FIG. 8. The conductive balls 142 comprise a conductive material and/or a eutectic material such as solder or other type of material. After mounting the conductive balls 142 onto the RDL 134, testing of the packaged semiconductor device is then performed, in some embodiments.

Figure 9:
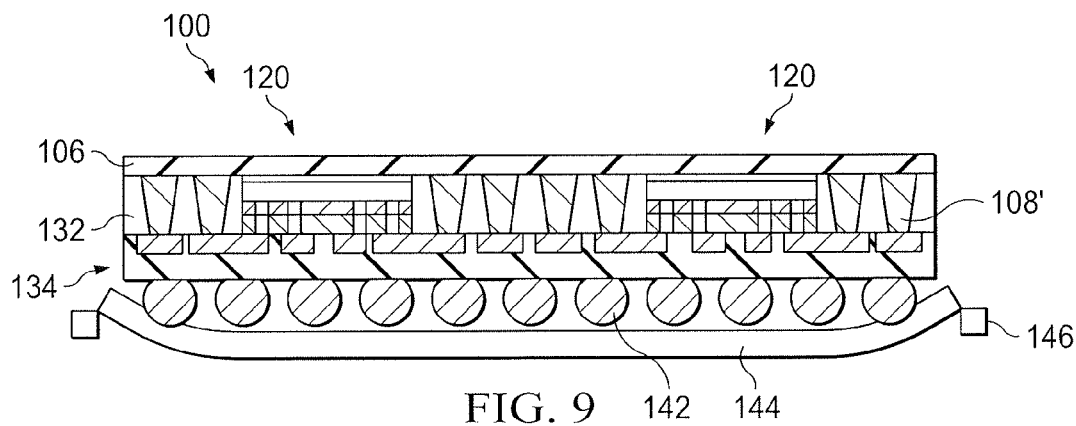

The package 100 and semiconductor devices 120 are then debonded from the carrier wafer 102, as shown in FIG. 9. The conductive balls 142 may be coupled to a tape 144 which is attached to a support 146, as illustrated in FIG. 9. The carrier wafer 102 is then removed from the package 100 and semiconductor devices 120. Note that the package 100 is inverted from the packaging step shown in FIG. 8 to the packaging step shown in FIG. 9. The adhesive 104 is also removed from the package 100 and semiconductor devices 120 when removing the carrier wafer 102 in some embodiments.

Figure 10:
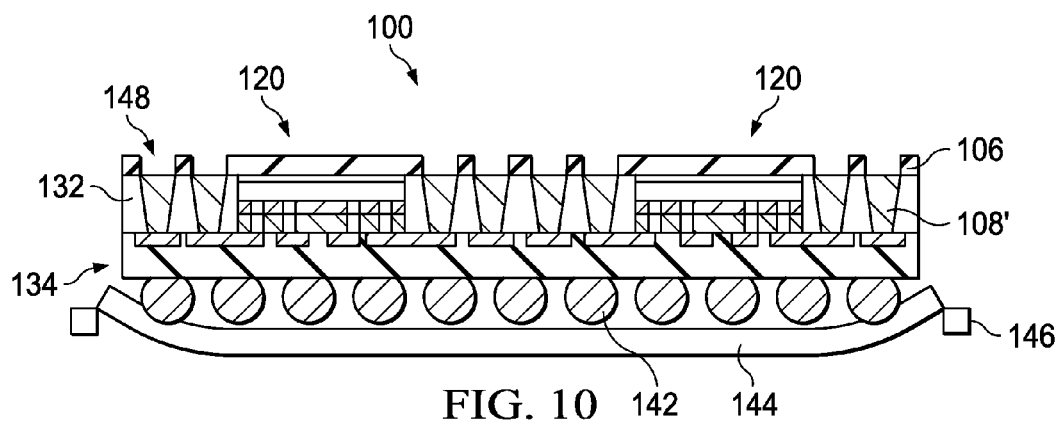
Figure 11:
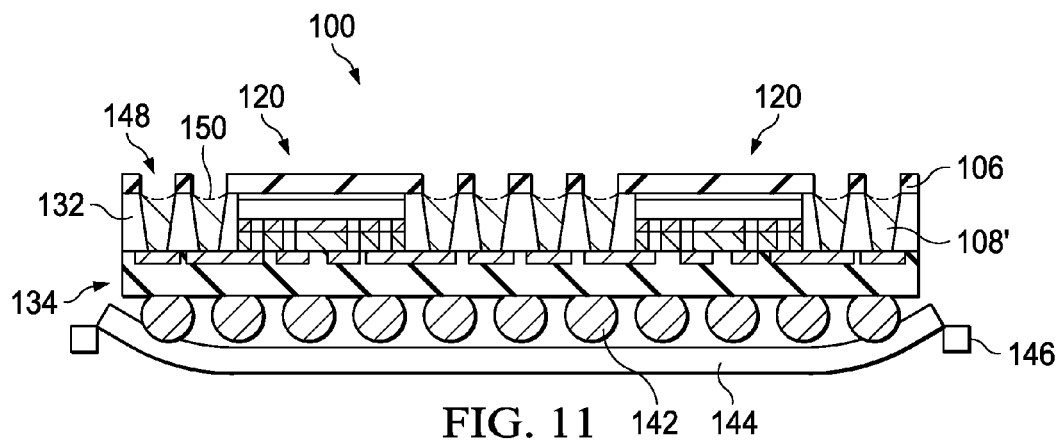

Openings 148 are then formed over each of the TPV's 108' within the insulating material 106, as shown in FIG. 10. The openings 148 are formed in the insulating material 106 in some embodiments using a laser drilling process. Alternatively, other methods may be used to form the openings 148. In some embodiments, the exposed surfaces of the TPV's 108' are recessed, as shown in FIG. 11. The TPV's 108' may be recessed using an etch process or other process, for example. The TPV's 108' may be recessed by about 0 μm to about 20 μm, or by other amounts, for example. In other embodiments, the surfaces of the TPV's 108' are not recessed.

Figure 12:
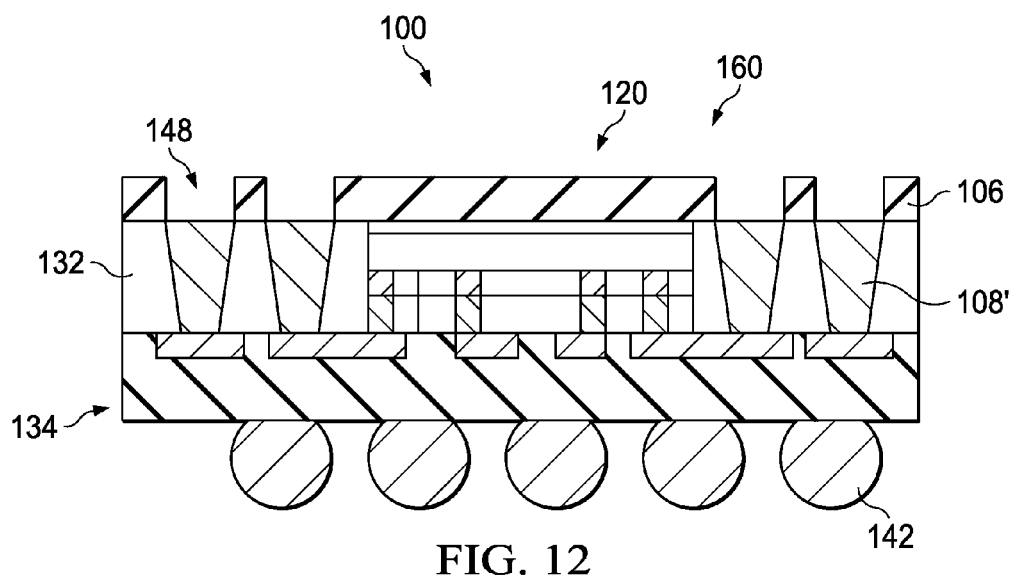
Figure 13:
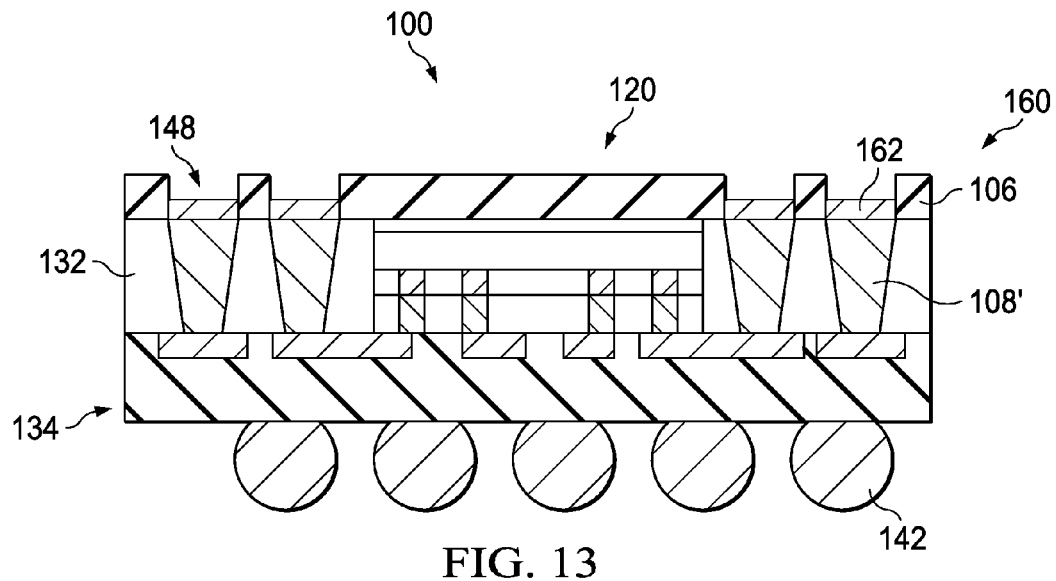
Figure 14:
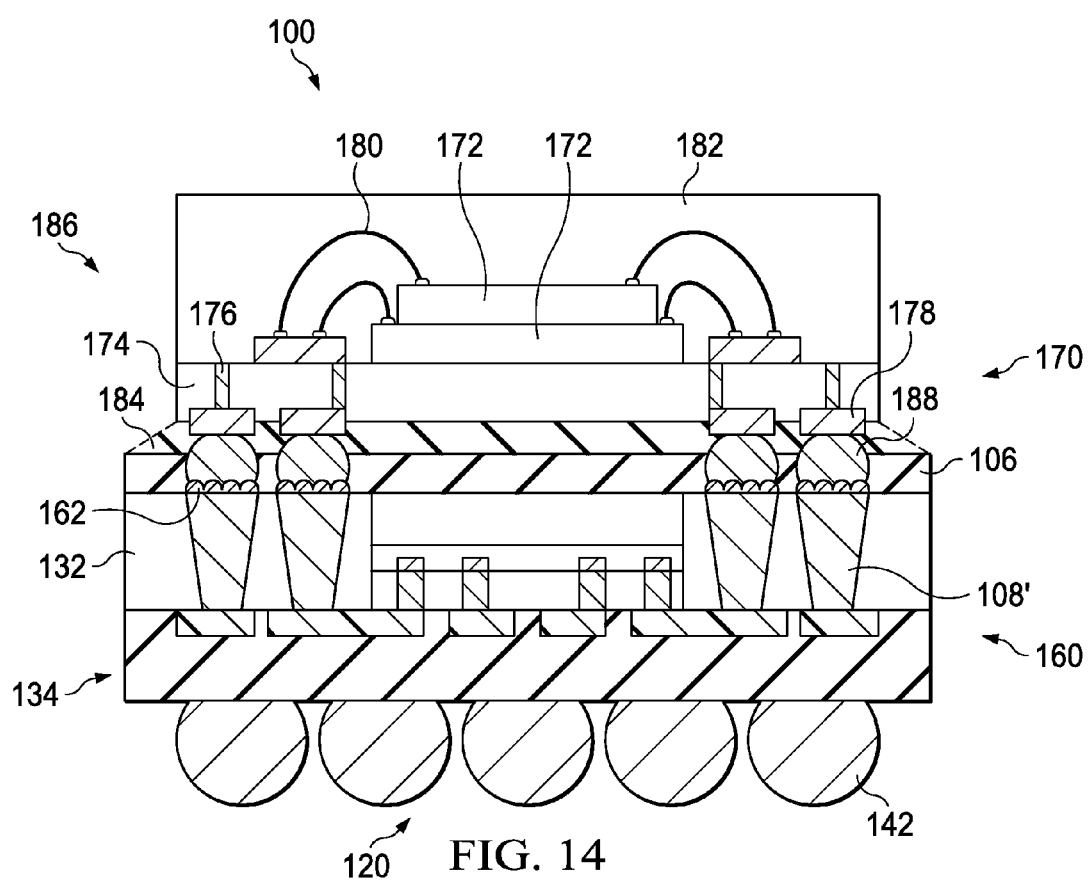
FIG. 14 is a cross-sectional view of a package-on-package (PoP) device in accordance with some embodiments.

The semiconductor devices 120 are then singulated within separate packages 100 using a die saw, forming individual packaged semiconductor devices 160, as shown in FIG. 12. In some embodiments, a solder paste 162 is formed within the openings 148 over the TPV's 108', as illustrated in FIG. 13. In other embodiments, a solder paste 162 is not applied onto the surfaces of the TPV's 108'. The packaged semiconductor device 160 can then be packaged with another semiconductor device, as shown in FIG. 14. Alternatively, the packaged semiconductor device 160 can be used in an end application by making electrical connection to the TPV's 108' and/or the conductive balls 142.

FIG. 14 is a cross-sectional view of a package-on-package (PoP) device 186 in accordance with some embodiments. A packaged semiconductor device 160 that includes the tapered TPV's 108' is illustrated, packaged to another packaged semiconductor device 170. In the embodiment shown, the packaged semiconductor device 170 includes two integrated circuit dies 172 that are stacked vertically and coupled to a substrate 174 that includes a plurality of TPV's 176 formed therein. The integrated circuit dies 172 are coupled to the substrate 174 by wire bonds 180. A molding material 182 is disposed over the integrated circuit dies 172 and wire bonds 180. The TPV's 108' of packaged semiconductor device 160 are coupled to contacts 178 on packaged semiconductor device 170 by solder 188. In some embodiments, a solder paste 162 is formed on the surfaces of the TPV's 108'. In some embodiments, an underfill material 184 is disposed between the packaged semiconductor device 160 and packaged semiconductor device 170. In some embodiments, the solder paste 162 and/or the underfill material 184 are not included. The two packaged semiconductor devices 160 and 170 form a PoP device 186. Alternatively, a packaged semiconductor device 160 may be coupled to other types of packaged semiconductor devices 170, for example.

Figure 15:
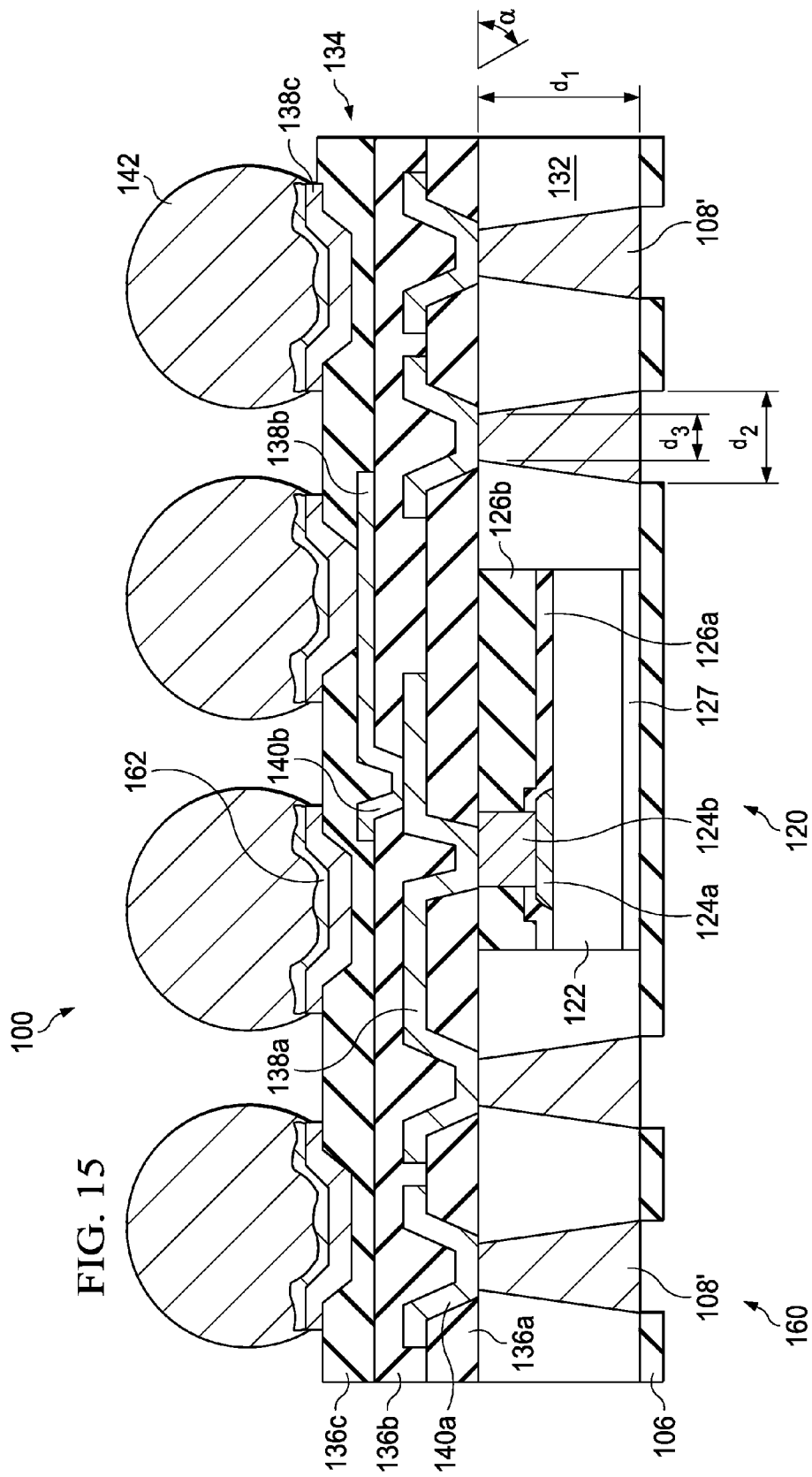
FIG. 15 shows a cross-sectional view of a packaged semiconductor device in accordance with some embodiments.

FIG. 15 shows a cross-sectional view of a packaged semiconductor device 160 in accordance with some embodiments. More details of the semiconductor device 120 and the RDL 134 are illustrated. The packaged semiconductor device 160 includes the RDL 134 and a plurality of TPV's 108' coupled to the RDL 134. Each of the plurality of TPV's 108' comprises a first region (e.g., a top region in FIG. 15) proximate the RDL 134 and a second region (a bottom region in FIG. 15) opposite the first region. The first region of the TPV's 108' comprises a first width comprising dimension $d_3$, and the second region comprises a second width comprising dimension $d_2$. The second width is greater than the first width. A semiconductor device 120 including an integrated circuit or die 122 is coupled to the RDL 134.

The semiconductor device 120 includes a contact 124*a* coupled to portions of the RDL 134 by wiring 124*b* which may comprise a conductive plug or other connector in some embodiments. Insulating material layers 126*a* and 126*b* comprise passivation, polymer, and/or insulating materials. A die attach film (DAF) 127 may be used to couple the semiconductor device 120 to the insulating material 106 of the package 100. The RDL 134 includes a plurality of insulating material layers 136*a*, 136*b*, and 136*c*. Wiring within the insulating material layers 136*a*, 136*b*, and 136*c* includes via portions 140*a* and 140*b* and conductive trace portions 138*a* and 138*b*. Portions of the wiring include an UBM structure 138*c* in some embodiments. The conductive balls 142 are coupled to the UBM structure 138*c*. An angle α of the tapered TPV's with respect to the RDL 134 is also illustrated in FIG. 15.

Figure 16:
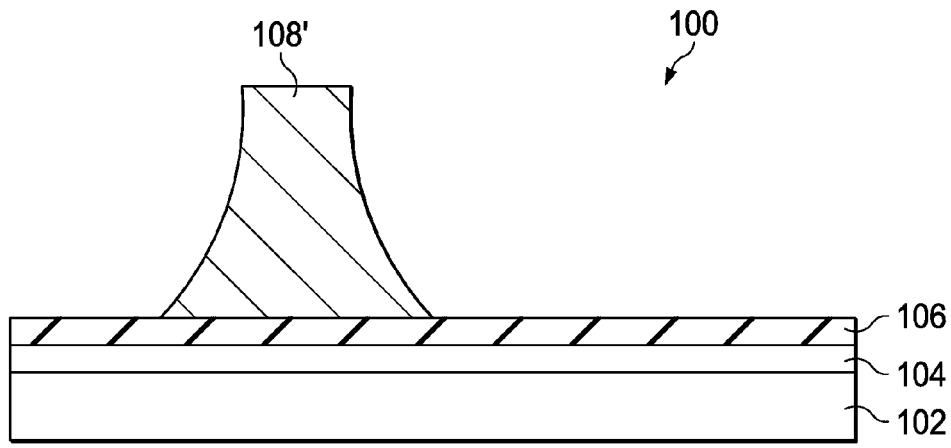
FIG. 16 illustrates a cross-sectional view of a portion of a packaging device in accordance with some embodiments.

FIG. 16 illustrates a cross-sectional view of a portion of a packaging device in accordance with some embodiments. Rather than having substantially straight tapered sidewalls as shown in FIG. 4, the TPV's 108' may have inwardly curved tapered sidewalls in some embodiments. The sidewalls curve inwardly, due to the nature of the etch process used to form the TPV's 108' in some embodiments, for example. Alternatively, the TPV 108' sidewalls may comprise other shapes.

Figure 17:
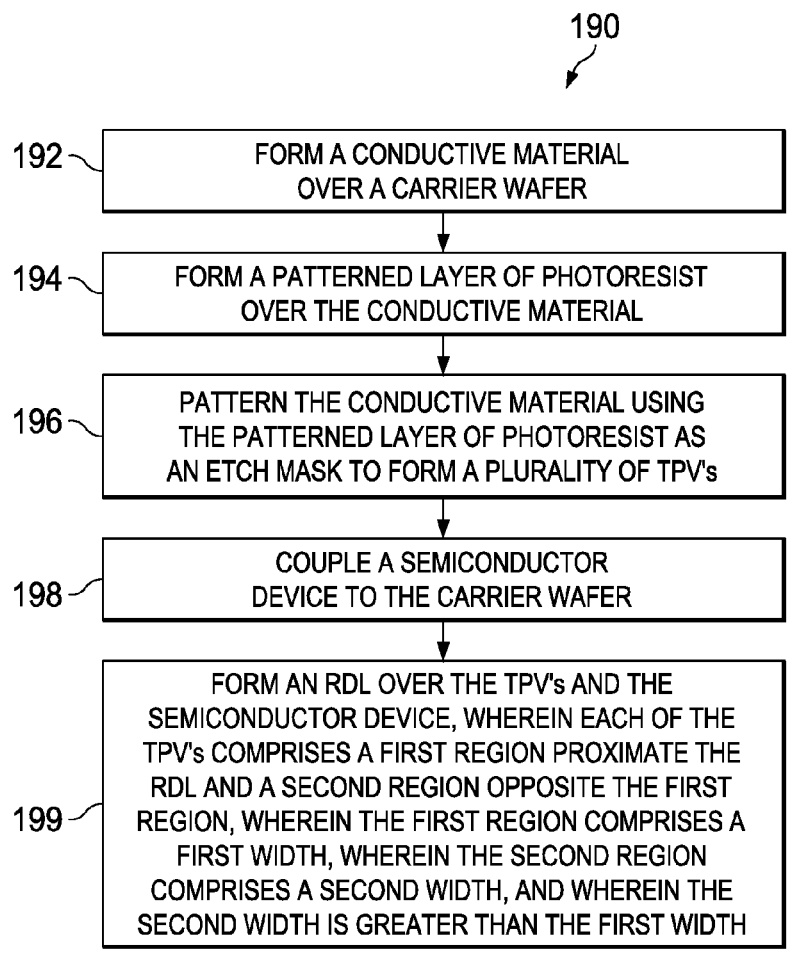
FIG. 17 is a flow chart of method of packaging a semiconductor device in accordance with some embodiments.

FIG. 17 is a flow chart 190 of method of packaging a semiconductor device 120 in accordance with some embodiments. In step 192, a conductive material 108 is formed over a carrier wafer 102 (see also FIG. 1). In step 194, a patterned layer of photoresist 110 is formed over the conductive material 108 (see FIG. 2.) In step 196, the conductive material 108 is patterned using the patterned layer of photoresist 110 as an etch mask to form a plurality of TPV's 108' (see FIG. 3). In step 198, a semiconductor device 120 is coupled to the carrier wafer 102 (see FIG. 5). In step 199, an RDL 134 is formed over the TPV's 108' and the semiconductor device 120 (see FIG. 7). Each of the TPV's 108' comprises a first region proximate the RDL 134 and a second region opposite the first region, wherein the first region comprises a first width, wherein the second region comprises a second width, and wherein the second width is greater than the first width (see FIG. 15).

Some embodiments of the present disclosure include packages 100 for semiconductor devices 100, and also include packaged semiconductor devices 160 packaged using the methods and packages 100 described herein. Some embodiments of the present disclosure also include PoP devices 186 that have been packaged using the novel packaged semiconductor devices 160 and packaging methods described herein. Other embodiments include packaging methods for semiconductor devices.

Advantages of some embodiments of the disclosure include providing novel packaged semiconductor devices that include TPV's that have a controlled height or thickness (e.g., dimension $d_1$). The packaging process has a low cost and a short packaging process time, resulting in reduced packaging costs and more efficient and faster through-put. In some embodiments, TPV height variation is eliminated, reducing yield loss. Furthermore, the novel packaging processes and structures described herein are easily implementable in manufacturing and packaging process flows.

In accordance with some embodiments of the present disclosure, a package for a semiconductor device includes an RDL and a plurality of TPV's coupled to the RDL. Each of the plurality of TPV's comprises a first region proximate the RDL and a second region opposite the first region. The first region comprises a first width and the second region comprises a second width. The second width is greater than the first width.

In accordance with other embodiments, a packaged semiconductor device includes a package including an RDL and a plurality of TPV's coupled to the RDL. Each of the plurality of TPV's comprises a first region proximate the RDL and a second region opposite the first region. The first region comprises a first width, and the second region comprises a second width. The second width is greater than the first width. An integrated circuit is coupled to the RDL.

In accordance with other embodiments, a method of packaging a semiconductor device includes forming a conductive material over a carrier wafer, forming a patterned layer of photoresist over the conductive material, and patterning the conductive material using the patterned layer of photoresist as an etch mask to form a plurality of TPV's. The method includes coupling a semiconductor device to the carrier wafer, and forming an RDL over the plurality of TPV's and the semiconductor device. Each of the plurality of TPV's comprises a first region proximate the RDL and a second region opposite the first region, wherein the first region comprises a first width and the second region comprises a second width. The second width is greater than the first width.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package for a semiconductor device, comprising:
a redistribution layer (RDL);
a plurality of through package vias (TPV's) coupled to the RDL, wherein each of the plurality of TPV's extends through a molding material and comprises a first region proximate the RDL and a second region opposite the first region, wherein the first region comprises a first width, wherein the second region comprises a second width and has a topmost surface that is recessed relative to a topmost surface of the molding material, the molding material being coterminous with the topmost surface and a lowermost surface of the plurality of TPV's, the topmost surface being curved along an entirety of the topmost surface, and wherein the second width is greater than the first width;
an insulating layer on the topmost surface of the molding material, the insulating layer having openings defined therein, the openings aligned with the second region of the each of the plurality of TPV's; and
a plurality of connectors contacting and extending from the recessed, topmost surface of the second region.

2. The package according to claim 1, wherein each of the plurality of TPV's comprise sidewalls extending from the first region to the second region, wherein at least a majority of a length of the sidewalls is inwardly curved.

3. The package according to claim 2, wherein an angle of the sidewalls with respect to a surface of the RDL comprises about 45° to about 95°.

4. The package according to claim 1, wherein the plurality of TPV's comprise one or more elements selected from the group consisting essentially of copper, aluminum, tungsten, nickel, palladium, gold, and combinations thereof.

5. The package according to claim 1, wherein the second width comprises about 10 µm to about 1,000 µm; or wherein the first width comprises about 10% to about 95% of the second width.

6. The package according to claim 1, wherein the plurality of connectors is a plurality of solder balls.

7. A packaged semiconductor device, comprising:
a package including a redistribution layer (RDL) and a plurality of through package vias (TPV's) coupled to the RDL, wherein each of the plurality of TPV's comprises a first region proximate the RDL and a second region opposite the first region, each of the plurality of TPV's comprising inwardly curved tapered sidewalls, wherein at least a majority of a length of the inwardly curved tapered sidewalls is inwardly curved, wherein the first region comprises a first width, wherein the second region comprises a second width, wherein the second width is greater than the first width; and
an integrated circuit coupled to the RDL, the integrated circuit having a first side proximate the RDL and a second side opposite the first side, the integrated circuit having sidewalls extending from the first side to the second side; and
a molding compound contacting and surrounding the inwardly curved tapered sidewalls of the plurality of TPV's and sidewalls of the integrated circuit, the molding compound extending from the first side of the integrated circuit to the second side of the integrated circuit, the molding compound extending along and coterminous with the inwardly curved tapered sidewalls of the plurality of TPV's.

8. The packaged semiconductor device according to claim 7, wherein the molding compound is disposed between the plurality of TPVs and around the integrated circuit, wherein the molding compound is operable to conform to the inwardly curved tapered sidewalls of each of the plurality of TPV's, wherein the molding compound has curved surfaces at an interface between the molding compound and the inwardly curved tapered sidewalls.

9. The packaged semiconductor device according to claim 7, wherein the integrated circuit is coupled to a first side of the RDL, further comprising a plurality of conductive balls coupled to a second side of the RDL.

10. The packaged semiconductor device according to claim 7, wherein the packaged semiconductor device is a package-on-package device and comprises a first packaged semiconductor device comprising the package and the integrated circuit, the packaged semiconductor device further comprising a second packaged semiconductor device coupled to the first packaged semiconductor device.

11. The packaged semiconductor device according to claim 10, wherein the second packaged semiconductor device is coupled to the second region of one of the plurality of TPV's of the first packaged semiconductor device.

12. The packaged semiconductor device according to claim 11, wherein the second packaged semiconductor device is adjacent to the second region of one of the plurality of TPV's of the first packaged semiconductor device, and wherein solder balls connect the second packaged semiconductor device to the second region of one of the plurality of TPV's of the first packaged semiconductor device.

13. The package according to claim 7, wherein the second region is recessed.

14. The package according to claim 13, wherein an angle of the inwardly curved tapered sidewalls with respect to a surface of the RDL comprises about 45° to about 95°.

15. The package according to claim 7, wherein the second width comprises about 10 µm to about 1,000 µm; or wherein the first width comprises about 10% to about $_{95}$% of the second width.

16. The package according to claim 7, wherein the plurality of TPV's comprise a thickness of about 10 µm to about 1,000 µm.

17. A packaged semiconductor device comprising:
- an integrated circuit die having a first surface and an opposing, second surface, a contact pad on the first surface and an isolation layer on the second surface;
- a molding compound having sidewalls coterminous with sidewalls of the integrated circuit die;
- a through package via (TPV), the TPV having a first end substantially co-planar with a first outermost surface of the molding compound and a second end substantially co-planar with a second outermost surface of the molding compound, the TPV having inwardly curved tapered sidewalls extending from the first end to the second end, wherein at least a majority of a length of the inwardly curved tapered sidewalls is inwardly curved, wherein the second end has a larger diameter than the first end; and
- a redistribution layer (RDL) on the first outermost surface of the molding compound, the RDL being in electrical contact with the contact pad and with the TPV.

18. The packaged semiconductor device according to claim 17, wherein the second end is recessed.

19. The packaged semiconductor device according to claim 17, wherein the second end has a second diameter, wherein the second diameter is about 10 µm to about 1,000 µm, wherein the first end has a first diameter, and wherein the first diameter comprises about 10% to about 95% of the second diameter.

20. The packaged semiconductor device according to claim 17, wherein the packaged semiconductor device is a package-on-package device comprising:
- a first packaged semiconductor device, the first packaged semiconductor device comprising the integrated circuit die, the molding compound, the TPV and the RDL; and
- a second packaged semiconductor device connected to the first packaged semiconductor device via solder ball, the solder ball connecting the second end of the TPV to the second packaged semiconductor device, the second packaged semiconductor device comprising:
  - a second integrated circuit die on a substrate; and
  - a second molding compound surrounding the second integrated circuit die, the second molding compound separate from the molding compound.

* * * * *